Figure 1:
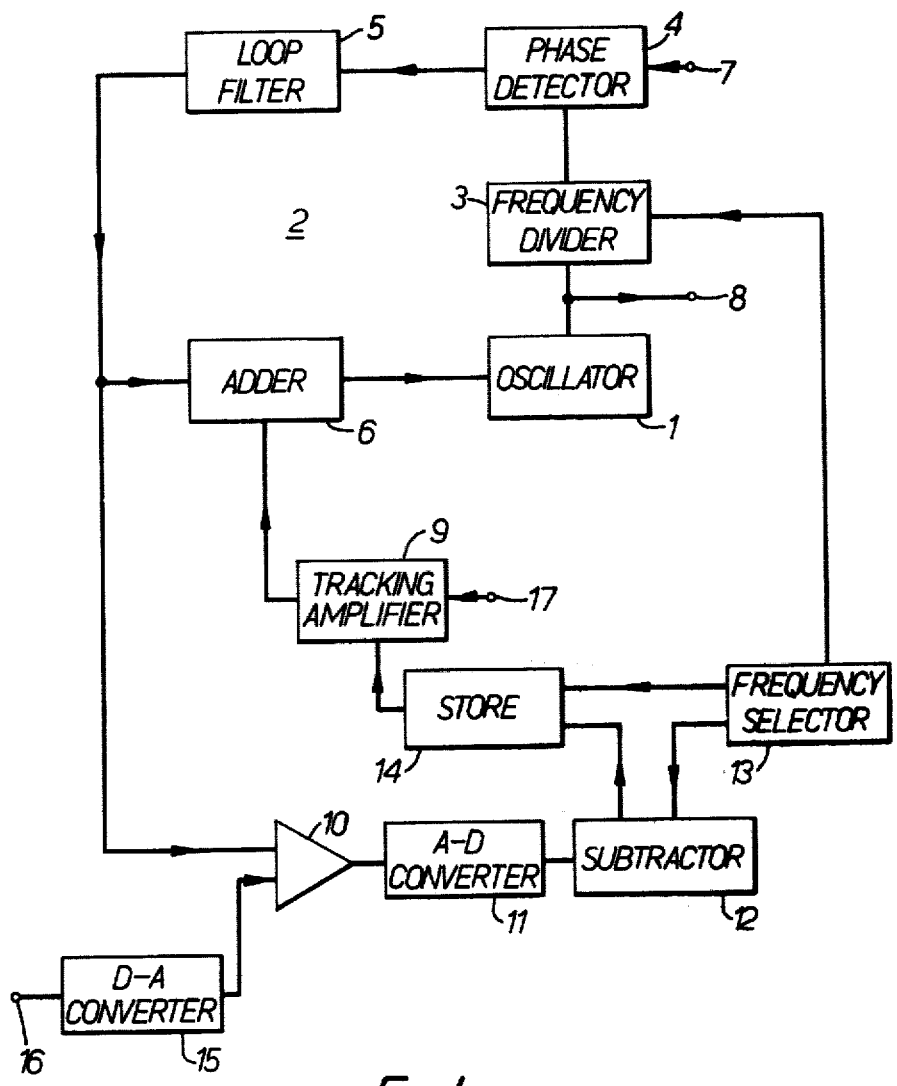

United States Patent [19]

Owen

[11] 4,309,674

[45] Jan. 5, 1982

[54] FREQUENCY MODULATORS WITH COMPENSATION FOR VARIATIONS IN MODULATION SENSITIVITY

[75] Inventor: David P. Owen, Dunstable, England

[73] Assignee: Marconi Instruments Limited, Chelmsford, England

[21] Appl. No.: 71,573

[22] Filed: Aug. 31, 1979

[30] Foreign Application Priority Data

Sep. 2, 1978 [GB] United Kingdom ............... 35423/78
Dec. 13, 1978 [GB] United Kingdom ............... 48337/78
Mar. 14, 1979 [GB] United Kingdom ............... 09034/79

[51] Int. Cl.³ ............................................ H03C 3/08
[52] U.S. Cl. ...................................... 332/18; 332/19; 455/63
[58] Field of Search ...................... 332/18, 19, 30 V; 455/110, 113, 42, 63

[56] References Cited

U.S. PATENT DOCUMENTS 4,117,422  9/1978  Hunt .................................... 332/18
4,125,817  11/1978  Bagdasarjanz et al. ............. 332/19
4,189,689  2/1980  Triplett ................................ 332/18

Primary Examiner—Siegfried H. Grimm
Attorney, Agent, or Firm—Diller, Ramik & Wight

[57] ABSTRACT

In a frequency modulation system, the frequency modulation sensitivity of an oscillator is itself a function of the carrier frequency of the oscillator. The frequency modulation sensitivity is measured and stored for particular carrier frequencies, and subsequently used to control the amplitude of the modulation signal, so that when a frequency modulation signal is fed to the oscillator, a frequency deviation is obtained which is accurately related to the amplitude of the modulation signal.

6 Claims, 3 Drawing Figures

FREQUENCY MODULATORS WITH COMPENSATION FOR VARIATIONS IN MODULATION SENSITIVITY

This invention relates to frequency modulation systems and is intended for use primarily where a frequency modulation signal having an accurate frequency deviation is required from a variable frequency signal source. Generally the frequency modulation sensitivity of an oscillator forming part of the variable frequency signal source is itself a function of frequency. It is known to use a frequency modulation tracking network having frequency dependent characteristics and which operates to control the gain of an amplifier in dependence on the output frequency of the oscillator such that the amplifier whose gain is controlled compensates for variations in the frequency modulation sensitivity of the oscillator. The procedure for setting up a frequency modulation tracking network is time consuming and expensive, and must be repeated if any component in the network or oscillator which affects the frequency modulation sensitivity is altered or replaced.

The present invention seeks to provide an improved frequency modulation system.

According to a first aspect of this invention a method of producing a frequency modulated signal includes the steps of determining the frequency modulation sensitivity of an oscillator at a selected carrier frequency, varying the frequency of oscillation of the oscillator about the selected carrier frequency in accordance with a signal representative of a required frequency modulation, and controlling the amplitude of the representative signal in dependence on said frequency modulation sensitivity.

According to a second aspect of this invention a signal generator for producing a frequency modulated signal includes a variable frequency oscillator whose frequency of oscillation is variable about a selected carrier frequency in accordance with a signal representative of a required frequency modulation, means for determining the frequency modulation sensitivity of the oscillator at the selected carrier frequency and means for controlling the amplitude of the representative signal in dependence thereon.

Figure 2:
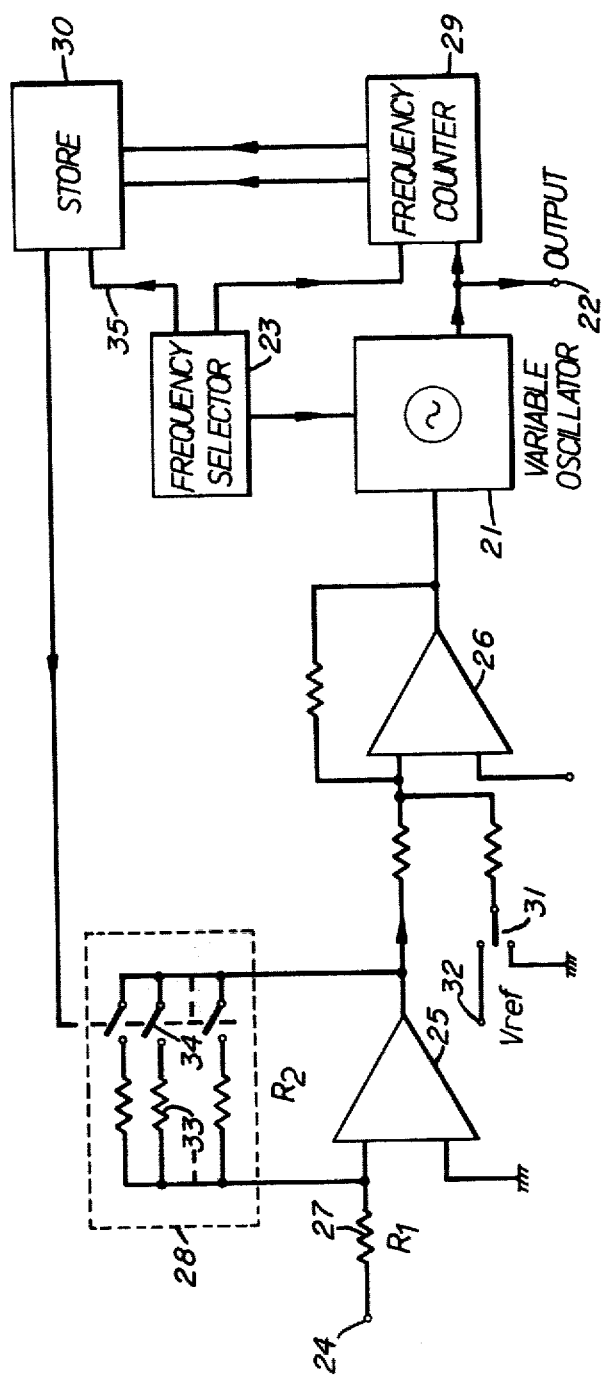
Figure 3:
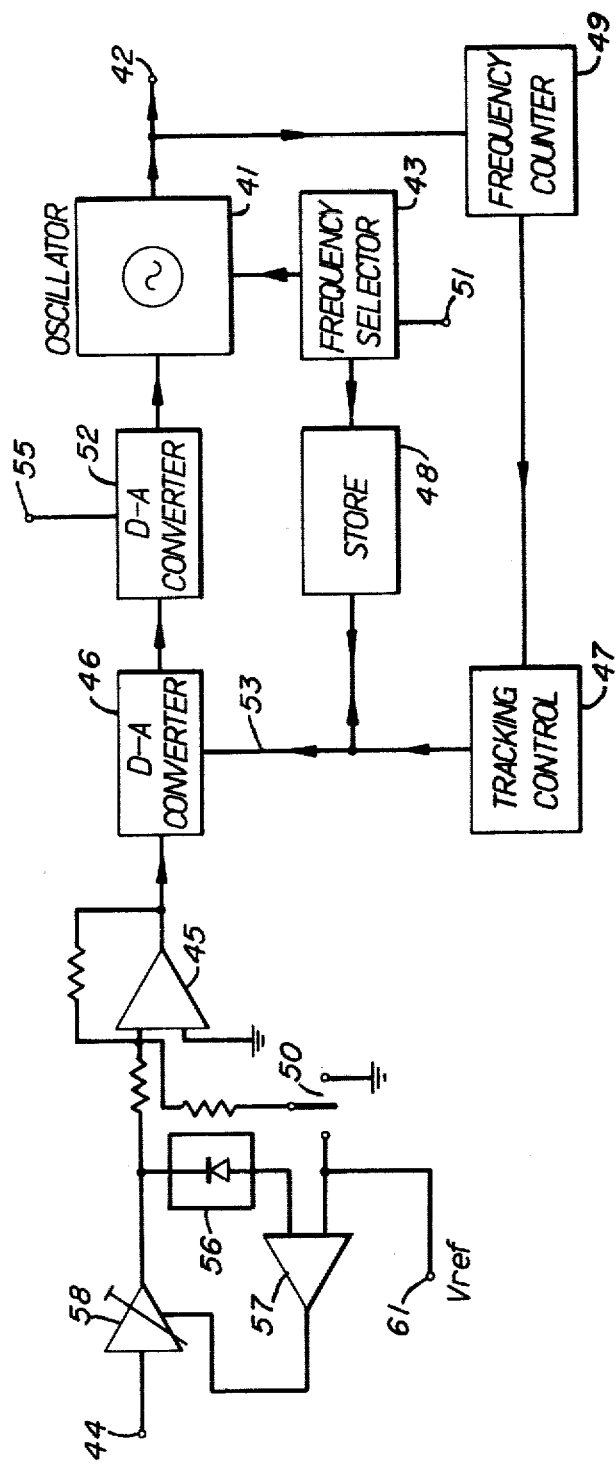

The invention is further described by way of example with reference to the accompanying drawings in which, FIGS. 1, 2 and 3 illustrate different forms of signal generator for producing a frequency modulated signal in accordance with the present invention.

Referring to FIG. 1, a signal generator consists of a variable oscillator 1, which forms part of a phase lock loop 2, which also includes a frequency divider 3, a phase detector 4, a loop filter 5 and an adder 6, in that order. In operation, a reference frequency, typically 1 kHz, is applied to terminal 7 and phase compared with the signal obtained from the frequency divider 3. By means of this arrangement the output frequency of the oscillator which is provided at terminal 8 is locked to a multiple N times the reference frequency, where N is the division ratio of the frequency divider 3. By altering the value of N, which is generally an integer, the output carrier frequency of the oscillator can be changed in value as required. In order to produce a frequency modulated signal, a signal whose level varies in accordance with the required modulation is applied to the adder 6 so as to modify the control feedback signal obtained from the phase detector 4 via the loop filter 5. Because the frequency modulation sensitivity of the oscillator 1 is invariably dependent on the carrier frequency at which it is oscillating, it is necessary to control the amplitude of the signal combined with the control feedback signal at the adder 6. For this purpose a tracking amplifier 9 is provided which modifies the gain of the frequency modulation signal as a function of a selected carrier frequency value.

In order to determine the frequency modulation sensitivity of the oscillator 1, the additional circuitry illustrated in FIG. 1 is provided. The control feedback signal obtained via the loop filter 5 is applied to one input of a comparator 10 and the output of this is fed via an analogue-to-digital converter 11 to a subtractor 12. Under the control of a frequency selector 13 digital data stored temporarily in the subtractor 12 is entered into a store 14. The frequency selector 13 also determines the output frequency provided at terminal 8 by selecting the divisor value N of the frequency divider 3. The comparator 10 also receives a signal from a terminal 16 via a digital-to-analogue converter 15.

The frequency modulation sensitivity of the oscillator 1 at a particular carrier frequency is obtained as follows. By selecting a suitable value of N the output frequency provided by the oscillator 1 at output terminal 8 is set to f+500 kHz, where f is the reference frequency value applied a terminal 7. When the phase lock loop 2 is settled, a digital signal is applied to terminal 16 so that the analogue signal applied by the converter 15 to the comparator 10 is of approximately the same value as the signal obtained from the loop filter 5. The signal applied to terminal 16 is subsequently held constant during the measurement sequence. If convenient, the signal obtained at terminal 16 can be derived indirectly from the output of the phase detector 4. The difference in the two signals fed to the comparator 10 is converted into a digital word and entered into the subtractor 12, where it is temporarily stored.

The output frequency obtained at terminal 8 is then set to f by suitably selecting the value of N under the control of the frequency selector 13. When the phase lock loop 2 is again settled, the result of the new comparison made by comparator 10 is entered into the subtractor 12 and subtracted from the value already stored there. The result of the subtraction is then entered into a location of the store 14 which is identified with the value f of the selected carrier frequency under control of the frequency selector 13. Thus the store 14 contains a signal which is representative of the change in voltage required to off-set the oscillator 1 by a frequency of 500 kHz. If this voltage is V, it follows that the frequency sensitivity of the oscillator 1 in hertz per volt is proportional to 1/V. The digital information of V can then be used to directly control the tracking amplifier 9 by arranging that the gain of the amplifier is proportional to V.

By this means a predetermined frequency modulation deviation can be obtained at output terminal 8 when an appropriate frequency modulation signal is applied at terminal 17. The choice of the off-set frequency used, which in the above example was 500 kHz can be of any convenient size, but is determined primarily by the maximum expected deviation of the frequency modulation signal obtained at input terminal 17.

The signal generator illustrated in FIG. 1 may be arranged to go through a measurement sequence each time that the output carrier frequency is changed significantly, but this has the disadvantage that the frequency settling characteristics of it will be degraded as the output frequency will temporarily go to a frequency other than the required output frequency. Alternatively the signal generator may go through a series of measurement sequences at predetermined times, typically when the signal generator is first switched on so that the required frequency modulation sensitivity is measured at a number of points over the entire frequency band at which the signal generator can be used. The number of points is determined by the accuracy required and the linearity of the frequency modulation sensitivity characteristic. The information obtained at each point, which represents a different carrier frequency, is stored in the store 14 together with the value of the carrier frequency to which it relates. The information held in the store 14 can then be accessed by the frequency selector 13 whenever the output carrier frequency is changed.

The store 14 may be constituted as a read-only memory in which case a calibration sequence is initially performed for the whole frequency range of the signal generator and the results of the measurement subsequently permanently stored. This enables the signal generator to be used immediately after it is switched on if required, i.e the need to perform an initial calibration sequence following switch on as described above is avoided.

Where information relating to more than one selected carrier frequency is held in store 14 at any one time, the frequency modulation sensitivity for intermediate carrier frequencies can be determined by interpolating between the values stored. This latter mode of operation requires fewer individual selected carrier frequencies at which sensitivity measurements are obtained.

Referring to FIG. 2, a signal generator comprises a variable oscillator 21, which provides an output to a terminal 22. The output signal consists of a carrier frequency, which is determined by a frequency selector 23, which controls the variable oscillator 21 to produce the required frequency. The frequency selector 23 may be provided with input terminals (not shown) by means of which signals representative of a required carrier frequency value can be entered into the frequency selector. In order to produce a frequency modulated signal, a signal whose level varies in accordance with the required modulation is applied to an input terminal 24 and via amplifiers 25 and 26 to the variable oscillator 21. Because the frequency modulation sensitivity of the oscillator 21 is invariably dependent on the carrier frequency at which it is oscillating, it is necessary to control the amplitude of the signal applied to terminal 24 so as to compensate for this dependence. The amplitude is controlled by means of the amplifier 25, which is provided with a feedback network consisting of a resistor 27 and a resistor network 28 connected in a feedback loop by means of which the gain of the amplifier 25 can be varied. The other amplifier 26 is used to enable the frequency modulation sensitivity of the oscillator 21 to be determined for particular values of the carrier frequency.

A frequency counter 29 is also used in the process of determining the frequency modulation sensitivity, in a manner described below, and the frequency modulation sensitivity value is stored in a store 30 so that it can be used to modify the gain of the amplifier 25 as necessary.

The required frequency modulation sensitivity value is determined as follows. The switch 31 is initially connected to earth and the output frequency of the oscillator 21 is measured by the frequency counter 29 and temporarily stored in store 30. Switch 31 is then connected to a reference voltage level applied to terminal 32 so that a known change in the output voltage from amplifier 26 is obtained. This causes the oscillator 21 to change frequency and the new output frequency is measured by the frequency counter 29. The difference in the two output frequencies is then calculated by merely subtracting the later value from the store value to produce a resultant digital number n. The number n is directly proportional to the tuning sensitivity of the oscillator 21, since a known voltage increment Vref was used to change the frequency of oscillation.

The frequency modulation deviation $f_m$ which is produced by the modulation voltage $V_m$ is given by:

$$f_m = V_m \times \Delta V,$$

where $\Delta V$ is the frequency modulation sensitivity of the oscillator, (which is a function of the oscillator frequency).

In order for the frequency modulation deviation to be independent of the oscillator frequency, the modulating voltage $V_m$ must therefore be controlled such that it is proportional to the reciprocal of $\Delta V$. Since, as stated previously the oscillator sensitivity $\Delta V$ is proportional to the stored frequency change n, this can be accomplished by making $V_m$ proportional to the reciprocal of n and this function is provided by the amplifier 25.

The gain of the amplifier 25, which is given by simple feedback theory as R2/R1, where R1 is the value of resistor 27 and R2 is the value of the resistance network 28. In FIG. 2, the value R2 is made proportional to the reciprocal of n by using a set of series resistors 33 and switches 34 wired in parallel as shown. The switches 34 can be mechanical, but, in practice, would be electronic and are controlled to be either open circuit or short circuit according to the value of the digital number n held in store 30. Resistor switch networks of the kind represented by the resistor network 28 are commercially available in integrated circuit packages. As the gain of amplifier 25 thus becomes proportional to the reciprocal of n, this amplifier compensates for the variation in frequency modulation sensitivity and results in a frequency modulation deviation that is independent of the oscillator frequency. Each time the carrier frequency value is changed a new value for resistor 28 must be selected if the new carrier frequency value is significantly different from that previously used.

The signal generator illustrated in FIG. 2 may be arranged to go through a measurement sequence each time that the output carrier frequency is changed significantly, but this has the disadvantage that the frequency settling characteristic of it will be degraded as the output frequency will temporarily go to a frequency other than the required output frequency. Alternatively, the signal generator may go through a series of measurement sequences at predetermined times, typically when the signal generator is first switched on so that the required frequency modulation sensitivity is measured at a number of points over the entire frequency band at which the signal generator can be used. The number of points is determined by the accuracy required and the linearity of the frequency modulation sensitivity characteristic. The information obtained at each point which represents a different carrier frequency is stored in the store 30 together with the value of the carrier frequency to which it relates, this frequency information being provided from the frequency selector 23 over line 35. The information held in the store 30 can then be accessed by frequency selector 23 whenever the output carrier frequency is changed and a new value for resistor network 28 is accordingly selected.

In the arrangement illustrated in FIG. 2, the value R2 of the resistor network 28 is proportional to the reciprocal of n, but instead the value R1 of resistor 27 could be made directly proportional to n in order to achieve the same result. Resistor 27 would then consist of a number of serially connected resistors, which are selectively shorted out according to the value of n, but this form of resistor network is less easy to implement. Alternatively, the value of 1/n could be calculated by a controller, or simle processor (not shown) and this value could be used to control the value R1 of the resistor 27. Since resistor 27 is now required to be proportional to the reciprocal of this new number, a parallel configuration of series resistors and switches similar to resistor network 28 could be used to provide the required value R1.

The frequency counter 29 is advantageously provided as a reversible up/down counter instead of the simple frequency counter previously described, since it can then be used to enable the value of n to be obtained without the need to separately store the first frequency value and to subtract a second frequency value from it. In this alternative mode of operation, during the first frequency measurement for which switch 31 is connected to earth, the counter is arranged to count up and by suitable choice of polarity of Vref connected to terminal 32, this first frequency is arranged to be higher than the second frequency. The first measured frequency is retained in the counter, but subsequently during the next cycle when the switch 31 is connected to Vref, the counter is arranged to count downwards so that the remainder left in the counter is equal to the required value n which is then passed in store 30, together with the frequency value from frequency selector 23 to which it relates. This configuration is particularly advantageous since it avoids the need for a control system to perform any arithmetic functions.

The store 10 may be constituted as a read-only memory in which case a calibration sequence is initially performed for the whole frequency range of the signal generator and the results of the measurements are permanently stored. This enables the signal generator to be used immediately it is switched on if required since the need to perform an initial calibration sequence following switch on, as described previously, is avoided.

Where information relating to more than one selected carrier frequency is held in store 30 at any one time, the frequency modulation sensitivity for intermediate carrier frequencies can be determined by interpolating between the values stored. This latter mode of operation requires few individual selected carrier frequencies for which sensitivity measurements must be performed.

Referring to FIG. 3, a signal generator comprises a variable oscillator 41, which provides an output to a terminal 42. The output signal consists of a carrier frequency which is determined by a frequency selector 43, which controls the variable oscillator 41 to produce the required frequency. The frequency selector 43 is provided with an input terminal 51 by means of which signals representative of a required carrier frequency value can be entered into the frequency selector. In order to produce a frequency modulated signal, a signal whose level varies in accordance with the required modulation is applied to an input terminal 44 and via an amplifier 45 to the variable oscillator 41. Because the frequency modulation sensitivity of the oscillator 41 is invariably dependent on the carrier frequency at which it is oscillating, it is necessary to control the amplitude of the signal applied to terminal 44 so as to compensate for its dependence. The amplitude is controlled by means of a multiplying digital-to-analogue converter 46, which is provided with a second input obtained from a tracking control circuit 47, and a store 48. The circuit contains additional components which are used in the process of determining the frequency modulation sensitivity of the oscillator 41, and the frequency modulation sensitivity value relating to a particular carrier frequency is stored in the store 48 so that it can be used to modify the multiplication factor provided by the converter 46 as necessary to compensate for the nonlinear response of the oscillator 41.

The required frequency modulation sensitivity value is determined as follows. At a particular oscillation frequency of interest the precise output frequency of the oscillator 41 is measured by a frequency counter 49; the frequency is initially selected by applying the appropriate input signal to the frequency selector 43. At this stage no input signal is applied to terminal 44 and the switch 50 is connected to earth. When the switch 50 is connected to the reference voltage present at terminal 61, the change in input voltage is detected by the amplifier 45 and this is passed via the converter 46 and a further multiplying digital-to-analogue converter 52 to the oscillator 41. The resulting frequency change is measured by the frequency counter 49. The purpose of the system is to obtain a known frequency change from a given change in input voltage and the system can be calibrated by changing the value of a multiplication factor M applied over line 53 to an input of the converter 46 such that the required change of output frequency is obtained for a change in input voltage which corresponds to the value of the reference voltage present at terminal 61. The value of the factor M which is required at the converter 46 may be stored for future use in the store 48 or may be measured each time that a new output frequency is selected.

The value of the factor M is determined by noting the frequency different which is produced in the frequency counter 49 when the switch 50 is moved from earth potential to the reference voltage and adjusting, by means of the tracking control circuit 47, the value of the factor M to produce the required frequency shift. This can be achieved by means of a simple feedback loop as shown; that is to say, the feedback loop which includes the converter 46, the oscillator 41, the frequency counter 49 and the tracking control circuit 47. The feedback loop continues to operate until a predetermined frequency change is detected when the switch 50 is operated. The appropriate value of the factor M is then entered into store 48 together with the value of the carrier frequency, from frequency selector 43, to which that value relates. The additional converter 52 can be used to set up the magnitude of the frequency deviation which is required. This in effect is a variable gain control, which determines the amplitude or peak-to-peak value of the modulation signal which is present at the output of the converter 46 whereas the signal applied to terminal 44 determines the slope or profile of the frequency deviation. During the calibration phase at which the value of the frequency modulation sensitivity is determined, a signal is ideally present at terminal 55 which provides the maximum variable deviation.

The use of the feedback system in FIG. 3 avoids the need to provide a linear converter 46, since any non-linearities in the converter are automatically allowed for. However, it is necessary to use a linear converter for the multiplying digital-to-analogue converter 52, since clearly its input which is connected to terminal 55 is not part of the calibrating feedbackloop. It is assumed that the value of the reference voltage present at terminal 61 is accurately reproducible.

It is advantageous if the frequency modulation signal derived from input terminal 44 and presented to the input of amplifier 45 is of approximately the same amplitude as the reference voltage present at terminal 61. For this purpose a detector circuit 56 is connected as shown and a rectified signal produced thereby is compared with the reference voltage at a comparator 57, which in turn is used to adjust the gain of an amplifier 58.

Conveniently the frequency difference which is measured using the frequency counter 49 can be determined using a pre-setable up-down counter. In this case it is arranged that a first larger frequency is used to pre-set the counter with the switch 50 in one of its two positions. Subsequently when the switch 50 is set to its other position the counter is arranged to count downwards and the residual count corresponds to the required different frequency.

This process of obtaining values of the multiplication factor M for specific carrier frequency values is repeated throughout the entire frequency range of the oscillator 41 until a table of values has been built up in the store 48. Subsequently when it is desired to produce, during normal operation, an output frequency at terminal 42 which has a certain level of frequency deviation, it is merely necessary to adjust the input to the converter 46 in accordance with the corresponding value of the multiplication factor which is obtained from store 48 when the required carrier frequency value is passed to it from the frequency selector 43.

I claim:

1. A signal generator for producing a frequency modulated signal including a variable frequency oscillator whose frequency of oscillation is variable about a selected carrier frequency in accordance with a signal representative of a required frequency modulation, means for determining the frequency modulation sensitivity of the oscillator at the selected carrier frequency and means for controlling the amplitude of the representative signal in dependence thereon, the frequency modulation sensitivity of the oscillator being determined by measuring the extent to which changes in the frequency of oscillation are dependent on changes in the level of a frequency control signal fed to it, the oscillator being a free running oscillator and there being provided means for altering the amplitude of a frequency control signal by a predetermined step size to produce a resultant frequency change in the oscillator output, means for bringing the oscillator output frequency back to its initial value and means for deriving therefrom the frequency modulation sensitivity, the means for bringing the oscillator output frequency back to its initial value including an amplitude signal multiplier which is arranged to multiply the frequency control signal by a variable factor, the signal multiplier comprising a multiplying digital-to-analogue converter to which the variable factor is applied in digital form.

2. A signal generator as claimed in claim 1 and wherein the frequency modulation sensitivity is determined for a plurality of carrier frequencies, and the respective values thereof stored and subsequently used to control the amplitude of the signal representative of the required degree of modulation when a corresponding carrier frequency is selected.

3. A method of producing a frequency modulated signal by controlling the output of a variable frequency oscillator within an operating frequency range thereof, which comprises the steps of
   (a) measuring the frequency modulation sensitivity of the oscillator over said operating frequency range;
   (b) storing a signal indicative of said frequency modulation sensitivity over said operating frequency range;
   (c) generating a frequency modulated signal by controlling the output of said variable frequency oscillator within said operating frequency range in accord with a modulating signal modified by said stored signal so as to compensate for non-linearity in the modulation sensitivity; and
   (d) repeating steps (a) and (b) during times other than during step (c) whereby frequency modulation sensitivity of said oscillator is repetitively updated.

4. A method of producing a frequency modulated signal by controlling the output of a variable frequency oscillator over a selected one of a plurality of operating frequency ranges thereof, each range corresponding to a selected different carrier frequency which comprises the steps of
   (a) measuring the frequency modulation sensitivity of the oscillator over each operating frequency range corresponding to each of said different carrier frequencies;
   (b) storing signals indicative of each frequency modulation sensitivity measured in step (a);
   (c) generating a frequency modulated signal by controlling the output of said variable frequency oscillator about a selected carrier frequency over the corresponding operating frequency range in accord with a modulating signal modified by that one of said stored signals corresponding to the selected carrier frequency so as to compensate for the non-linearity of the modulation sensitivity; and
   (d) repeating steps (a) and (b) during times other than during step (c) whereby frequency modulation sensitivity of said oscillator is repetitively updated.

5. In a system for generating frequency modulated signals, the combination of:
   a variable frequency oscillator having a frequency control input and an output at which frequency modulated signals appear non-linearly in accord with a modulation signal at said input;
   means for providing a modulating signal to said input whereby the system generates a frequency modulated signal at said output which, in the absence of compensation, is non-linearly related to such modulating signal;
   selector means for causing said oscillator output to generate said frequency modulated signal about a selected one of a plurality of different carrier frequencies;
   means for periodically measuring said non-linearities at each of said carrier frequencies to produce corresponding signals whose values indicate the corresponding nonlinearities and means for storing said values, whereby said values which are stored are repetitively updated; and means responsive to said selector means for applying a compensating signal to said input in accord with that one of said stored signals which corresponds to the selected carrier frequency whereby the frequency modulated signal at said output is compensated for said non-linearity.

6. In a system for generating frequency modulated signals, the combination of:

a variable frequency oscillator having a frequency control input and an output at which frequency modulated signals appear non-linearly in accord with a modulation signal at said input;

means for providing a modulating signal to said input whereby the system generates a frequency modulated signal at said output which, in the absence of compensation, is non-linearly related to such modulating signal;

selector means for causing said oscillator output to generate said frequency modulated signal within a selected one of a plurality of different carrier frequency ranges;

means for periodically measuring said nonlinearities at each of a selected plurality of carrier frequencies lying respectively within one of said carrier frequency ranges to produce corresponding signals whose values indicate the corresponding nonlinearities and means for storing said values, whereby said values which are stored are repetitively updated; and means responsive to said selector means for applying a compensating signal to said input in accord with that one of said stored signals which corresponds to the selected carrier frequency range whereby the frequency modulated signal at said output is compensated for said non-linearity.

* * * * *